(12) United States Patent
Hiyama

(10) Patent No.: US 12,395,164 B2
(45) Date of Patent: Aug. 19, 2025

(54) SWITCHING ELEMENT DRIVE CIRCUIT

(71) Applicant: Mitsubishi Electric Corporation, Tokyo (JP)

(72) Inventor: Kazuaki Hiyama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 18/559,840

(22) PCT Filed: Jul. 27, 2021

(86) PCT No.: PCT/JP2021/027649
§ 371 (c)(1),
(2) Date: Nov. 9, 2023

(87) PCT Pub. No.: WO2023/007569
PCT Pub. Date: Feb. 2, 2023

(65) Prior Publication Data
US 2024/0283443 A1   Aug. 22, 2024

(51) Int. Cl.
*H03K 17/08* (2006.01)
*H03K 17/082* (2006.01)
*H03K 17/16* (2006.01)
*H03K 19/003* (2006.01)

(52) U.S. Cl.
CPC ......... *H03K 17/0828* (2013.01); *H03K 17/16* (2013.01); *H03K 19/00346* (2013.01)

(58) Field of Classification Search
CPC ................ H03K 17/08; H03K 17/081; H03K 17/08116; H03K 17/082; H03K 17/0828; H03K 17/16; H03K 17/168; H03K 19/003; H03K 19/00346
See application file for complete search history.

(56) References Cited

U.S. PATENT DOCUMENTS 6,717,785 B2 * 4/2004 Fukuda .............. H03K 17/0828
361/86
7,295,412 B2   11/2007 Sasaki et al.
9,570,905 B2 * 2/2017 Koishi ................. H03K 17/163

FOREIGN PATENT DOCUMENTS

JP   4223331 B2   2/2009

OTHER PUBLICATIONS

International Search Report issued in PCT/JP2021/027649; mailed Aug. 31, 2021.

* cited by examiner

*Primary Examiner* — Long Nguyen
(74) *Attorney, Agent, or Firm* — Studebaker Brackett PLLC

(57) ABSTRACT

In the present disclosure, a buffer outputs a gate drive signal indicating the same logic level as an element control signal, and an inverting buffer outputs a base drive signal indicating the opposite logic level to the element control signal. The resistance is interposed between the output of the buffer and the gate of an IGBT. A PNP bipolar transistor has its emitter connected to the gate of the IGBT and its collector connected to reference potential. A diode is interposed between the output of the buffer and a base of the PNP bipolar transistor. An output of the inverting buffer is connected to the base of the PNP bipolar transistor through a resistance.

8 Claims, 8 Drawing Sheets

F I G. 1
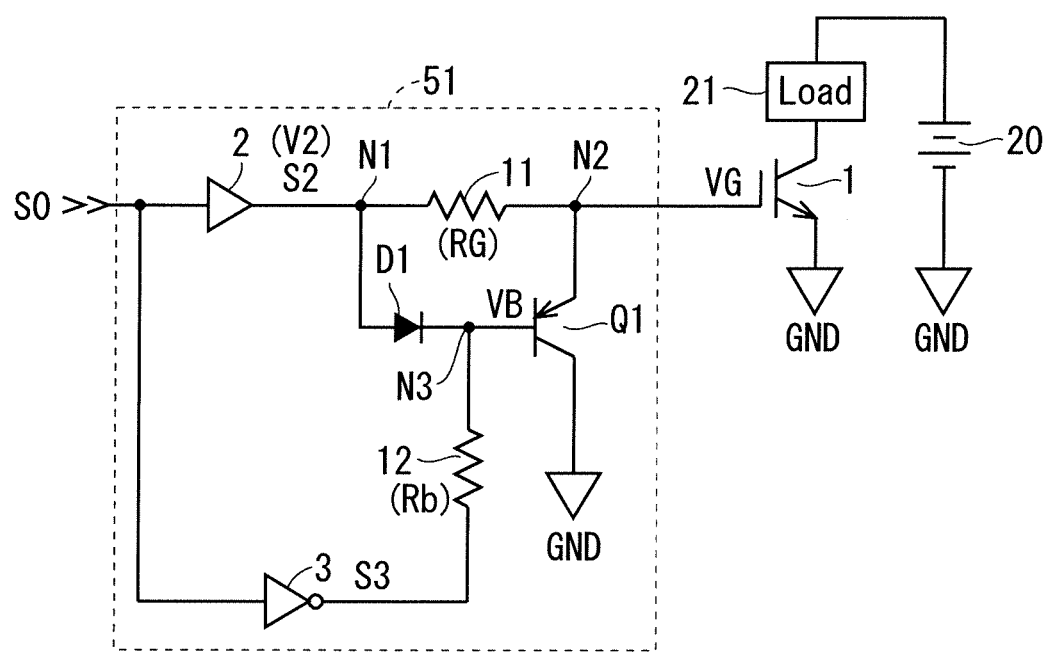

F I G. 5
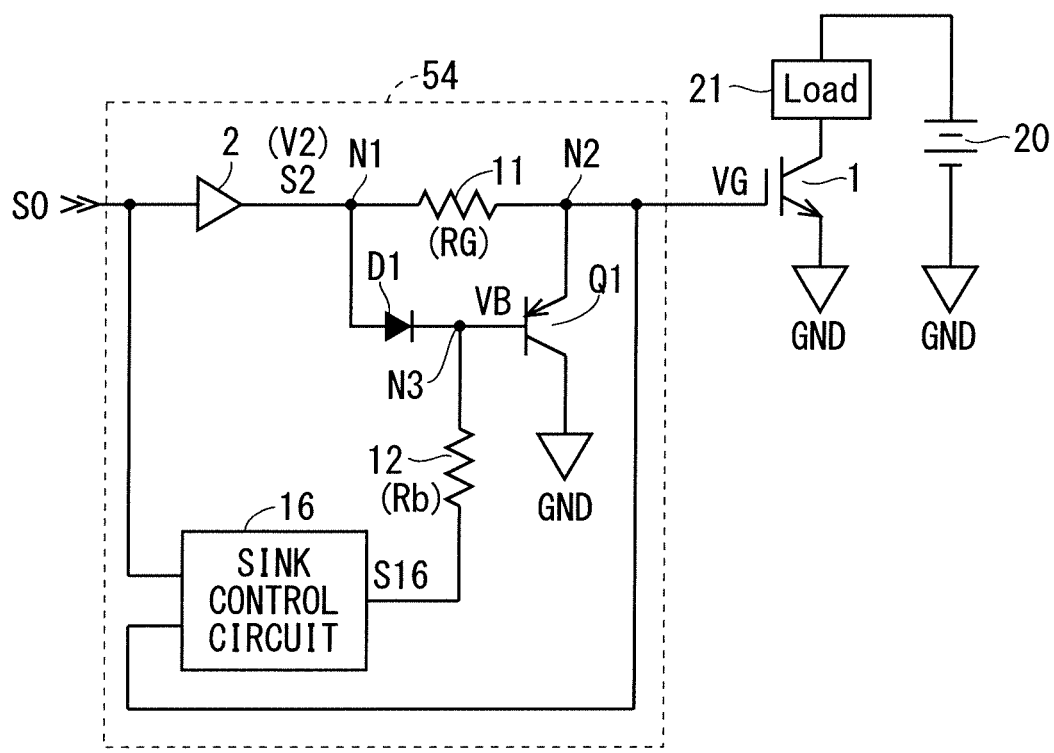

F I G. 7
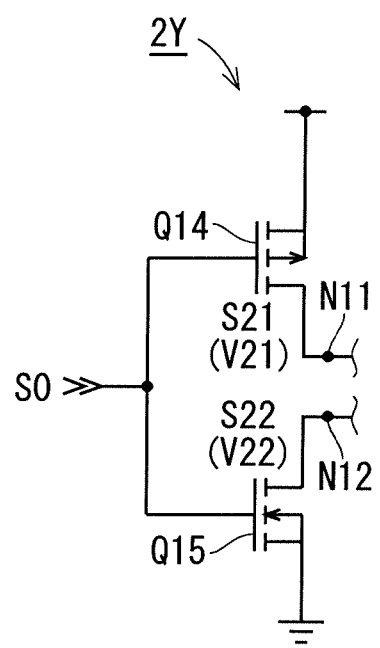

SWITCHING ELEMENT DRIVE CIRCUIT

TECHNICAL FIELD

The present disclosure relates to a switching element drive circuit having a function of suppressing an increase in load current of a switching element in an overcurrent state.

BACKGROUND ART

As a semiconductor switching element, an Insulated Gate Bipolar Transistor (IGBT), a Metal Oxide Semiconductor Field Effect Transistor (MOSFET), and the like are adopted.

When an overcurrent state occurs in which the load current flowing through the semiconductor switching element increases excessively due to the load short circuit of the semiconductor switching element, this damages the semiconductor switching element. Therefore, a protection circuit is provided to protect the semiconductor switching element from an overcurrent state by detecting the overcurrent state of the semiconductor switching element based on an increase in On voltage of the semiconductor switching element. A protection circuit having such an overcurrent detection function is disclosed in Patent Document 1, for example.

A conventional protection circuit masks the overcurrent detection function of the protection circuit for a certain period of time after the semiconductor switching element is turned On in order to prevent malfunction.

Another method of achieving overcurrent detection function is a second method, which involves detecting the current flowing through a small-area current-sensing cell connected in parallel with the switching element using a shunt resistance. The second method is commonly applied to IPMs (Intelligent Power Modules) and the like.

PRIOR ART DOCUMENTS

Patent Document(s)

[Patent Document 1] Japanese Patent No. 4223331

Problem to be Solved by the Invention

The protection circuit described above uses the On voltage of the semiconductor switching element as an overcurrent detection parameter. Specifically, the overcurrent state is determined when the On voltage of the semiconductor switching element exceeds a predetermined threshold voltage for overcurrent detection.

However, in the above protection circuit, a mask period is required to be provided during which the overcurrent state is not determined for a certain period from the semiconductor switching element is turned On until the On voltage drops below the threshold voltage for overcurrent detection. Note that the above-described certain period is referred to, for example, a "Miller plateau".

As described above, the conventional protection circuit has the problem that the overcurrent detection function is disabled during the mask period immediately after turning On; therefore, there is a period during which the overcurrent state of the switching element cannot be detected.

Next, the second method will be considered which involves detecting the current flowing through a small-area current-sensing cell connected in parallel with the switching element of an IPM or the like using a shunt resistance. In the second method, a low-pass filter with a low cutoff frequency for a signal detected by the current-sensing cell is required to be provided in order to prevent malfunction due to the switching noise at turning On, because of this, there is a problem that the detection of the overcurrent state immediately after turning On is delayed.

Further, there is another problem in that the current-sensing cell is built into the switching element which requires extra pads and the like for the current-sensing cell and wiring, increasing the manufacturing cost of the switching element including the current-sensing cell.

An object of the present disclosure is to solve the above-described problems and to provide a switching element drive circuit that can suppress an increase in load current flowing through a switching element in the overcurrent state even immediately after the switching element is turned on.

Means to Solve the Problem

A switching element drive circuit of the present disclosure is the switching element drive circuit for driving an N-channel switching element having a gate electrode with an insulated gate structure, including a gate drive circuit that outputs a gate drive signal based on an element control signal received from outside, a gate resistance interposed between an output of the gate drive circuit and a gate electrode of the switching element, having one end thereof connected to a first node on an output side of the gate drive circuit, and having an other end thereof connected to a second node on a gate electrode side of the switching element, a PNP bipolar transistor having an emitter connected to the second node and a collector connected to a reference potential, a diode having an anode connected to the first node and a cathode connected to a base of the PNP bipolar transistor at a third node, a base connection resistance having one end thereof connected to the third node, and a base drive circuit that outputs a base drive signal based on the element control signal, in which the base drive signal is given to an other end of the base connection resistance, a voltage obtained from the second node becomes a gate voltage of the switching element, the gate drive circuit sets a gate drive voltage of the gate drive signal to a power supply voltage during an On-operation period in which the element control signal indicates an On state of the switching element, and sets the gate drive voltage of the gate drive signal to reference potential during an Off-operation period in which the element control signal indicates an off state of the switching element, and the base drive circuit sets a base drive voltage of the base drive signal to reference potential during the On-operation period, and turns Off the PNP bipolar transistor by the base drive signal during at least a partial period in the Off-operation period.

Effects of the Invention

During the On-operation period, the On voltage of the switching element increases as the load current flowing through the switching element increases due to load short circuit or the like. As a result, the gate voltage of the switching element rises through the feedback capacitance parasitic on the gate electrode of the switching element, which raises the gate voltage higher than the gate drive voltage of the gate drive signal, establishing a positive feedback state in which the load current flowing through the switching element further increases.

On the other hand, due to the increase in the gate voltage accompanying the increase in the load current described above, the emitter voltage of the PNP bipolar transistor increases. This changes the base-emitter voltage of the PNP bipolar transistor in the negative direction. Therefore, in the overcurrent state in which the load current flowing through the switching element excessively increases, the base-emitter voltage changes to a level at which the PNP bipolar transistor is turned On.

As a result, in the switching element drive circuit of the present disclosure, the PNP bipolar transistor is always turned On when the switching element is in the overcurrent state. Therefore, the increase in gate voltage of the switching element is suppressed and the increase in load current flowing through the switching element is effectively suppressed.

Further, the switching element drive circuit of the present disclosure uses the base-emitter voltage of the PNP bipolar transistor as an overcurrent detection parameter; therefore, even immediately after the turning On of the switching element, the presence or absence of the overcurrent state can be detected without a hitch.

Therefore, the switching element drive circuit of the present disclosure can suppress an increase in load current flowing through the switching element in the overcurrent state even immediately after the turning On of the switching element.

The explicit purpose, feature, phase, and advantage of the present invention will be described in detail hereunder with attached drawings.

BRIEF DESCRIPTION OF DRAWINGS

FIG. 1 A circuit diagram illustrating a circuit configuration of a switching element drive circuit according to Embodiment 1.

FIG. 5 A circuit diagram illustrating a circuit configuration of a switching element drive circuit according to Embodiment 4.

FIG. 7 A circuit diagram illustrating a circuit configuration of another buffer in Embodiment 5.

DESCRIPTION OF EMBODIMENT(S)

<Problems of Conventional Protection Circuit>

Figure 8:
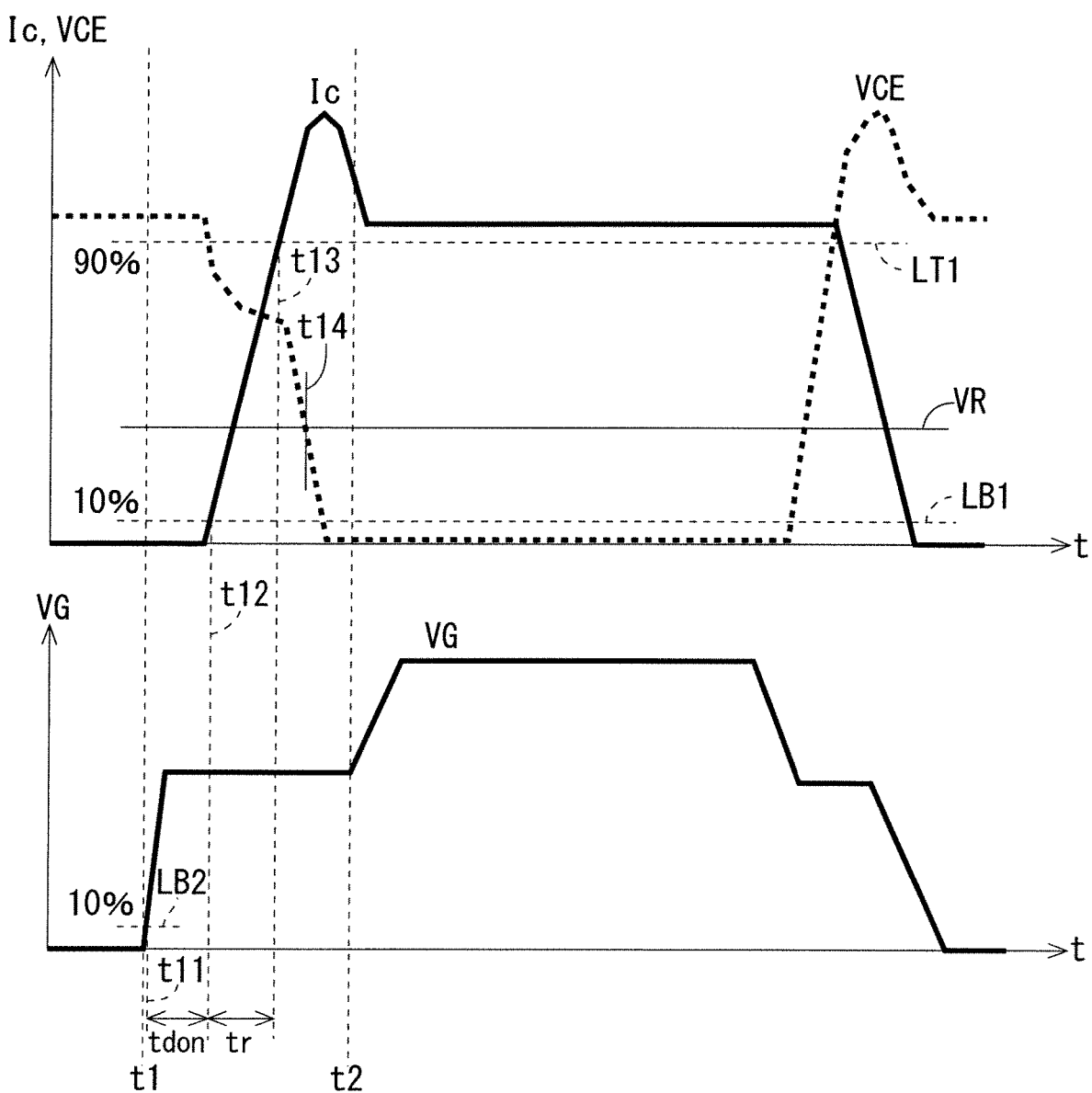
FIG. 8 A waveform graph illustrating turn-On operation and turn-Off operation of an IGBT.

FIG. 8 is a waveform graph illustrating turn-On operation and turn-Off operation of a typical IGBT. Hereinafter, problems of a conventional protection circuit for an IGBT in an overcurrent state will be described with reference to FIG. 8.

As illustrated in the drawing, the turn-On operation starts when the gate voltage VG rises at time t1. After that, at time t11, the gate voltage VG exceeds the lower reference line LB2 and further rises. After passing time t11 and the gate voltage VG rises again from time t2 through the Miller plateau in which a constant voltage value is maintained, and then the gate voltage VG stabilizes at the assumed maximum voltage value.

During the turn-On operation, the collector current Ic rises and reaches the lower reference line LB1 at time t12 and the upper reference line LT1 at time t13. After time t2, the collector current Ic stabilizes at a normal assumed maximum current value.

During the turn-On operation, the collector-emitter voltage VCE drops, falls below a threshold voltage VR at time t14 which comes after time t13, and the collector-emitter voltage VCE stabilizes at the minimum voltage value after time t2.

The lower reference line LB1 indicates the 10% line of the assumed maximum current value of the collector current Ic, and the upper reference line LT1 indicates the 90% line of the assumed maximum current value of the collector current Ic. The lower reference line LB2 indicates the 90% line of the assumed maximum voltage value of the gate voltage VG.

A switching delay time tdon is represented by a period from time t11 when the gate voltage VG reaches the lower reference line LB2 to time t12 when the collector current Ic reaches the upper reference line LT1. Also, the period from time t12 to time t13 where the collector current Ic reaches the upper reference line LT1 is represented by the rising period tr.

Note that the turn-Off-operation has been less relevant to the conventional problem, so the explanation is omitted.

The threshold voltage VR illustrated in FIG. 8 is a threshold voltage for detecting the overcurrent state with respect to the collector-emitter voltage VCE to be the On voltage. The conventional protection circuit has an overcurrent detection function that determines that an IGBT, which is a switching element, is in an overcurrent state when the collector-emitter voltage VCE exceeds the threshold voltage VR.

However, as illustrated in FIG. 8, the collector-emitter voltage VCE is higher than the threshold voltage VR from the turn-On start time t1 to time t14. That is, the collector-emitter voltage VCE is higher than the threshold voltage VR in the period immediately after turning On, regardless of whether or not an IGBT 1 is in the overcurrent state.

Accordingly, the protection circuit disables the above-described overcurrent detection function during the period from time t1 to time t14 as a mask period so that it can avoid erroneous detection of overcurrent.

In this manner, the conventional protection circuit needs to disable the overcurrent detection function during the mask period immediately after the turning On of the switching element such as IGBT; therefore, there remains a problem that an abnormal phenomenon cannot be detected in which a switching element such as an IGBT is in an overcurrent state due to a load short circuit or the like of the switching element.

In addition, the threshold voltage VR is affected by variations in temperature characteristics and manufacturing processes which makes accurate setting thereof difficult. For this reason, when the collector-emitter voltage VCE, which is the On voltage, is adopted as an overcurrent detection parameter, there also remains the problem that the overcurrent state of the IGBT cannot be detected accurately.

Embodiment 1

FIG. 1 is a circuit diagram illustrating a circuit configuration of a switching element drive circuit 51 according to Embodiment 1 of the present disclosure.

The switching element drive circuit 51 receives the power supply voltage Vcc as an operating power supply voltage, and drives and controls the On/Off operation of the IGBT 1 to be driven.

As illustrated in FIG. 1, the N-channel IGBT 1 serves as an N-channel switching element having a gate electrode with an insulated gate structure. The collector of the IGBT 1 is connected to a load 21, and the emitter is set to the ground level reference potential GND. A positive electrode of a power supply 20 is connected to the load 21. The negative electrode of power supply 20 is set to the reference potential GND.

The switching element drive circuit 51 of Embodiment 1 includes a buffer 2, an inverting buffer 3, a PNP bipolar transistor Q1, a resistance 11, a resistance 12, and a diode D1 as main components thereof.

The buffer 2 is a gate drive buffer that outputs a gate drive signal S2 based on an element control signal S0 received from the outside. In Embodiment 1, the buffer 2 constitutes a gate drive circuit.

The resistance 11 is interposed between the output of the buffer 2 and the gate electrode of the IGBT 1. One end of resistance 11 is connected to a node N1 on the output side of the buffer 2, and the other end is connected to a node N2 on the gate electrode side of the IGBT 1. The resistance 11 functions as a gate resistance, and the nodes N1 and N2 are a first node and a second node. The resistance 11 has a gate resistance value RG.

The voltage obtained from the node N2 becomes the gate voltage VG, and the IGBT 1 turns On when the gate voltage VG exceeds the threshold voltage Vth.

The PNP bipolar transistor Q1, which is an overcurrent protection transistor, has its emitter connected to the node N2 and its collector directly connected to the reference potential GND.

The diode D1, which is an overcurrent detection diode, is interposed between the output of the buffer 2 and the base of the PNP bipolar transistor Q1. In other words, the anode of the diode D1 is connected to the node N1, and the cathode of diode D1 is connected to the base of the PNP bipolar transistor Q1 and a node N3. The node N3 is a third node.

One end of the resistance 12, which is a base connection resistance, is connected to the node N3. The resistance 12 functions as a base current resistance and has a resistance value Rb.

The inverting buffer 3 functions as a base drive buffer that outputs a base drive signal S3 based on the element control signal S0. The base drive signal S3 output from the inverting buffer 3 is applied to the other end of the resistance 12. In Embodiment 1, the buffer 3 constitutes a base drive circuit.

The element control signal S0 indicates one of the "H" level indicating the On-operation period of the IGBT 1 and the "L" level indicating the Off-operation period of the IGBT 1. These "H" and "L" levels are logic levels.

Both the buffer 2 and the inverting buffer 3 operate with the "H" level as the power supply voltage Vcc and the "L" level as the reference potential GND.

Specifically, a gate drive voltage V2 of the gate drive signal S2 of the buffer 2 indicates one of the power supply voltage Vcc at the "H" level and the reference potential GND at the "L" level, whereas the base drive voltage V3 of the base drive signal S3 of the inverting buffer 3 indicates one of the power supply voltage Vcc at the "H" level and the reference potential GND at the "L" level.

The buffer 2 receives the element control signal S0 and outputs the gate drive signal S2. At this point, the gate drive signal S2 indicates the same logic level as the logic level indicated by the element control signal S0.

That is, when the element control signal S0 is "H", the gate drive voltage V2 becomes the power supply voltage Vcc at the "H" level, and when the element control signal S0 is "L", the gate drive voltage V2 becomes the reference potential GND at the "L" level.

The inverting buffer 3 receives the element control signal S0 and outputs the base drive signal S3. At this point, the base drive signal S3 indicates the opposite logic level to the logic level indicated by the element control signal S0.

That is, when the element control signal S0 is "H", the base drive voltage V3 becomes the reference potential GND at the "L" level, and when the element control signal S0 is "L", the base drive voltage V3 becomes the power supply voltage Vcc at the "H" level.

The buffer 2 and the inverting buffer 3 each have an appropriate driving capability according to the gate capacitance of the gate electrode of the IGBT 1 so that the gate capacitance of the IGBT 1 can be charged and discharged when the IGBT 1 is turned On/Off. The amplification modes of the buffer 2 and the inverting buffer 3 typically adopt current amplification rather than voltage amplification. Also, the resistance 11 serving as a gate resistance is provided for adjusting the switching speed of the IGBT 1 serving as a semiconductor switching element.

By raising the element control signal S0 from "L" to "H", the IGBT 1 can be turned On. During normal turn-On operation, the gate voltage VG of the IGBT 1 rises according to the gate drive voltage V2 in the gate drive signal S2 of the buffer 2. However, the resistance 11 is interposed between the output of the buffer 2 and the gate electrode of the IGBT 1; therefore, a drive current IG flows through the resistance 11. Therefore, the gate voltage VG is determined by the following expression (1).

$$VG = V2 - IG \times RG \tag{1}$$

At this point, the base drive voltage V3 of the base drive signal S3 of the inverting buffer 3 becomes the reference potential GND. That is, the node N3, which is the base of the PNP bipolar transistor Q1, is pulled down to the reference potential GND through the resistance 12. Meanwhile, the node N3 is connected to the cathode of the diode D1; therefore, the base potential VB of the PNP bipolar transistor Q1 is represented by the following expression (2).

$$VB = V2 - 1VF \tag{2}$$

Note that in the expression (2), VF represents the forward voltage of the diode D1.

Therefore, the base-emitter voltage VBE of the PNP bipolar transistor Q1 is represented by the following expression (3).

$$VBE = VB - VG = -1VF + IG \times RG \tag{3}$$

Therefore, the PNP bipolar transistor Q1 is turned Off during the normal On-operation period.

Here, when a load short circuit or the like, occurs in the IGBT 1, the collector current Ic, which is the output current of the IGBT 1, increases to be in the active operation state with the rated current being exceeded, which increases also the collector-emitter voltage VCE above the power supply voltage Vcc. As described above, an overcurrent state occurs in which the load current flowing through the IGBT 1 excessively increases due to the load short circuit or the like of the IGBT 1.

Therefore, the gate voltage VG rises through the feedback capacitance parasitic on the gate electrode of the IGBT 1 and becomes higher than the gate drive voltage V2. To be precise, the feedback capacitance is the parasitic capacitance between the collector and the gate of the IGBT 1.

When the relationship between the gate voltage VG and the gate drive voltage V2 becomes {V2<VG}, the drive current IG flows from the gate electrode of the IGBT 1 to the output side of the buffer 2 through the resistance 11. That is, the drive current IG flows in the direction opposite to that during the normal On operation of the IGBT 1.

Therefore, when the IGBT 1 is in the overcurrent state, the relationship between the gate voltage VG and the gate drive voltage V2 changes as illustrated in the expression (4) below.

$$VG = V2 + IG \times RG \quad (4)$$

As illustrated in the expression (4), as a result of the change in the gate voltage VG, the base-emitter voltage VBE of the PNP bipolar transistor Q1 changes in the negative direction as in the expression (5) below.

$$VBE = -1VF - IG \times RG \quad (5)$$

The PNP bipolar transistor Q1 is turned On by the base-emitter voltage VBE that has changed as illustrated in the expression (5), allowing a current to flow from the node N2 toward the reference potential GND.

As a result, the switching element drive circuit 51 of Embodiment 1 can suppress an increase in gate voltage VG of the IGBT 1. The resistance value Rb of the resistance 12 connected to the base of the PNP bipolar transistor Q1 at the node N3 is set so as to make the base current flow through the PNP bipolar transistor Q1 when the PNP bipolar transistor Q1 is turned On.

On the other hand, during the turn-Off operation, the base drive voltage V3 of the base drive signal S3 of the inverting buffer 3 rises to the power supply voltage Vcc; therefore, the base potential of the PNP bipolar transistor Q1 is pulled up through the resistance 12.

As a result, the PNP bipolar transistor Q1 maintains its Off state during the turn-Off operation period; therefore, the NP bipolar transistor Q1 does not affect the turn-Off operation.

During the On-operation period of the IGBT 1 including the turn-On operation, as the load current flowing through the IGBT 1 increases due to a load short circuit or the like, the collector-emitter voltage VCE, which is the On voltage of the IGBT 1, increases. As a result, the gate voltage VG of the IGBT 1 rises through the feedback capacitance parasitic on the gate electrode of the IGBT 1, which raises the gate voltage VG higher than the gate drive voltage V2 of the gate drive signal S2, establishing a positive feedback state in which the load current flowing through the IGBT 1 further increases.

On the other hand, due to the increase in the gate voltage VG accompanying the increase in the load current described above, the emitter voltage of the PNP bipolar transistor Q1 increases. This changes the base-emitter voltage VBE of the PNP bipolar transistor Q1 in the negative direction as illustrated in the above expression (5). Therefore, in the overcurrent state in which the load current flowing through the IGBT 1 excessively increases, the base-emitter voltage VBE changes to a level at which the PNP bipolar transistor Q1 is turned On.

As a result, the PNP bipolar transistor Q1 is always turned On when the IGBT 1 is in the overcurrent state. Therefore, the switching element drive circuit 51 of Embodiment 1 suppresses the increase in gate voltage VG of the IGBT 1 and effectively suppresses the increase in load current flowing through the IGBT 1.

The conventional switching element drive circuit does not have the PNP bipolar transistor Q1 that serves as an overcurrent protection transistor; therefore, the positive feedback state described above cannot be canceled.

On the other hand, in the switching element drive circuit 51 of Embodiment 1, the PNP bipolar transistor Q1 turns On immediately as the gate voltage VG of the IGBT 1 begins to rise beyond the power supply voltage Vcc through the feedback capacitance. Therefore, the switching element drive circuit 51 can swiftly suppress the increase in gate voltage VG of the IGBT 1, suppress the increase in collector current Ic, and thereby quickly cancelling the overcurrent state of the IGBT 1. Therefore, the IGBT 1 would not be in the overcurrent state and broken.

Figure 2:
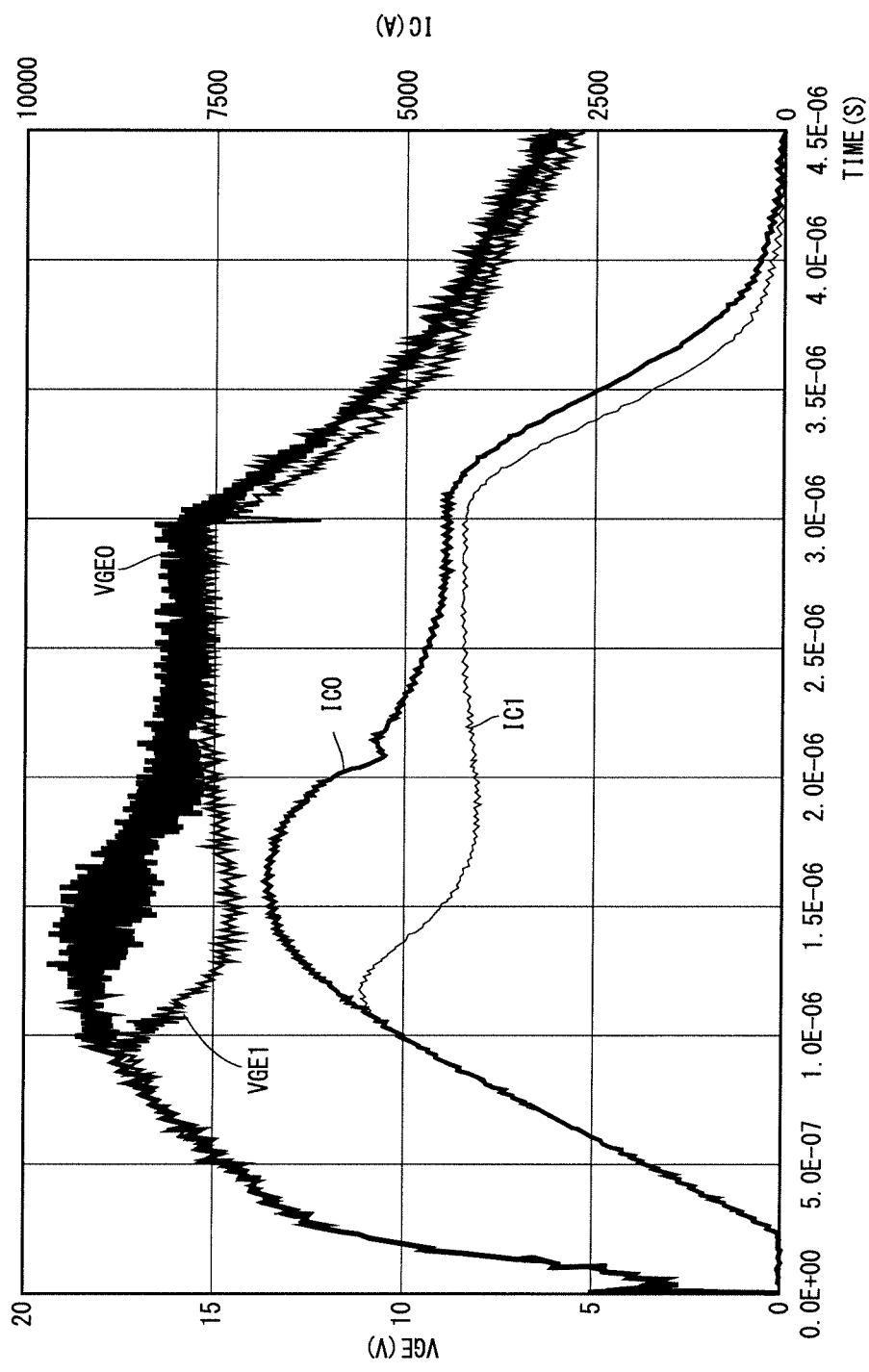
FIG. 2 A waveform graph illustrating the effect of Embodiment 1.

FIG. 2 is a waveform graph illustrating the effect of Embodiment 1. In the graph, the gate-emitter voltage VGE 1 and the collector current IC 1 are the gate-emitter voltage VGE and the collector current Ic when the switching element drive circuit 51 drives the IGBT 1.

Whereas, the gate-emitter voltage VGE 0 and the collector current IC 0 are the gate-emitter voltage VGE and the collector current Ic when the conventional switching element drive circuit without the PNP bipolar transistor Q1 drives the IGBT.

The emitter of the IGBT 1 is set to the reference potential GND of the ground level; therefore, the gate voltage VG and the gate-emitter voltage VGE have substantially the same value.

In FIG. 2, a rectangular wave with a pulse width of 3 us is input as the element control signal S0, and the power supply voltage Vcc is set to 15V.

As illustrated in the graph, even if the gate-emitter voltage VGE 1 exceeds 15V, which is the power supply voltage Vcc, and the overcurrent state occurs where the load current of the IGBT 1 increases, turning On of the PNP bipolar transistor Q1 allows the gate-emitter voltage VGE 1 to swiftly lower to around 15V.

On the other hand, even if the gate-emitter voltage VGE 0 exceeds 15V in the overcurrent state, the gate-emitter voltage VGE 0 cannot be lowered to around 15V. The gradual drop in the gate-emitter voltage VGE 0 illustrated in FIG. 2 is due to the gate drive circuit having a sink function.

Regarding the collector current Ic, the peak current is suppressed to about 5600 A in the collector current IC 1. Whereas, the collector current IC 0, the peak current is increased to about 7000 A in the collector current IC 0. Accordingly, the switching element drive circuit 51 of Embodiment 1 can reduce the peak value of the short circuit current by about 20% more than the conventional switching element drive circuit does.

As illustrated in FIG. 2, the switching element drive circuit 51 turns On the PNP bipolar transistor Q1 when the IGBT 1 is in the overcurrent state, thereby, reducing the gate-emitter voltage VGE and the collector current Ic and, consequently, mitigating the overcurrent state.

Further, the switching element drive circuit 51 of Embodiment 1 uses the base-emitter voltage VBE of the PNP bipolar transistor Q1 as an overcurrent detection parameter; therefore, even immediately after the turning On of the IGBT 1, the presence or absence of the overcurrent state can be swiftly detected without a hitch.

This is because, unlike the conventional protection circuit that uses the collector-emitter voltage VCE, which is the On voltage of the IGBT 1, as an overcurrent detection parameter, the switching element drive circuit 51 does not require to set a mask period for stopping the overcurrent detection function for a certain period immediately after the IGBT 1 is turned On.

Therefore, the switching element drive circuit 51 of Embodiment 1 can suppress an increase in load current flowing through the IGBT 1 in the overcurrent state even immediately after the turning On of the IGBT 1.

Further, the base-emitter voltage VBE at which the PNP bipolar transistor Q1 turns On is less affected by variations in temperature characteristics and manufacturing processes; therefore, the switching element drive circuit 51 can accurately detect whether or not the IGBT 1 is in the overcurrent state.

In addition, the switching element drive circuit 51 of Embodiment 1 eliminates the need to incorporate a current-sensing cell or the like into the IGBT 1, so that the manufacturing cost of the IGBT 1 can be reduced.

With respect to the element control signal S0, the gate drive voltage V2 of the gate drive signal S2 and the base drive voltage V3 of the base drive signal S3 indicate logic levels opposite to each other. Accordingly, during the Off-operation period of the IGBT 1 when the element control signal S0 is at "L", the gate drive voltage V2 of the gate drive signal S2 is at the "L" reference potential GND, and the base drive voltage V3 of the base drive signal S3 is at the "H" power supply voltage Vcc.

Therefore, during the Off-operation period of the IGBT 1, the power supply voltage Vcc is applied to the base of the PNP bipolar transistor Q1 through the resistance 12, which is a base connection resistance.

Therefore, the PNP bipolar transistor Q1 is turned Off by the base drive signal S3 during the entire period of the Off-operation period of the IGBT 1.

As a result, in the switching element drive circuit 51 of Embodiment 1, when the IGBT 1 is turned Off, the PNP bipolar transistor Q1 is off for certain; therefore, the presence of the PNP bipolar transistor Q1 does not adversely affect the turn-Off operation of the IGBT 1.

Furthermore, the gate drive circuit is configured with a buffer 2 that serves as a gate drive buffer for one unit and the base drive circuit is configured with an inverting buffer 3 that serves as a base drive buffer for one unit; therefore, the switching element drive circuit 51 of the present disclosure can be implemented with a relatively simple circuit configuration.

In order to adjust the turning On speed of the IGBT 1, the element control signal S0 may have a rising ramp waveform or a waveform that increases step by step instead of the rectangular wave. Also in this case, when an abnormality such as a load short circuit of the IGBT 1 occurs, the phenomenon that the gate voltage VG of the IGBT 1 rises occurs similarly to the case where the element control signal S0 is rectangular. However, as described above, when the PNP bipolar transistor Q1 is turned On when the IGBT 1 is in the overcurrent state; therefore, an increase in gate voltage VG can be suppressed, and the overcurrent state of the IGBT 1 can be swiftly canceled.

Embodiment 2

Figure 3:
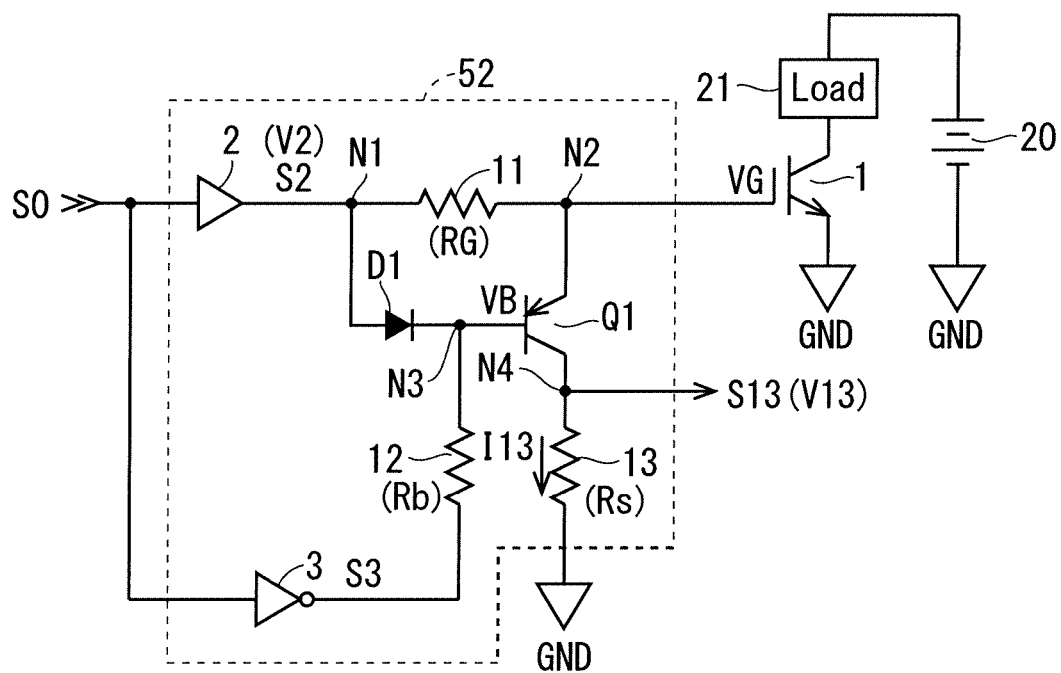
FIG. 3 A circuit diagram illustrating a circuit configuration of a switching element drive circuit according to Embodiment 2.

FIG. 3 is a circuit diagram illustrating a circuit configuration of a switching element drive circuit 52 according to Embodiment 2 of the present disclosure.

Parts similar to those of the switching element drive circuit 51 of Embodiment 1 illustrated in FIG. 1 are denoted by the same reference numerals, and descriptions thereof are omitted as appropriate. In the following, the characteristic portions of the switching element drive circuit 52 of Embodiment 2 will be mainly described.

The collector of the PNP bipolar transistor Q1 is connected to the reference potential GND through the resistance 13, which is a resistance for detection. The PNP bipolar transistor Q1 and one end of the resistance 13 are connected at a node N4. The resistance 13 has a resistance value Rs.

A detection signal S13 obtained from the node N4, which is a fourth node, is an overcurrent detection signal indicating whether or not the IGBT 1 is in the overcurrent state.

In the switching element drive circuit 52 having such a configuration, as in Embodiment 1, the PNP bipolar transistor Q1 is turned On in order to suppress the increase in gate voltage VG of the IGBT 1 when the load short circuit or the like of the IGBT 1 occurs.

Then, a current I13 flows from the gate electrode to the reference potential GND through the PNP bipolar transistor Q1 and the resistance 13 of the IGBT 1. At that point, a voltage drop occurs due to the resistance 13 having a resistance value Rs.

As a result, the detection voltage V13 indicated by the detection signal S13 is represented by the following expression (6).

$$V13 = I13 \times Rs \qquad (6)$$

On the other hand, when the IGBT 1 is not in the overcurrent state, the PNP bipolar transistor Q1 is in an off state; therefore, the node N4 is in a floating state, and significant detection voltage V13 cannot be obtained.

Therefore, based on the detection voltage V13 of the detection signal S13 output from the switching element drive circuit 52 of Embodiment 2, the presence or absence of the overcurrent state of the IGBT 1 can be detected from outside the switching element drive circuit 52.

Thus, the switching element drive circuit 52 of Embodiment 2 exhibits the following effects in addition to the effects of Embodiment 1.

In a relatively facilitated manner, the switching element drive circuit 52 of Embodiment 2 can detect the presence or absence of the overcurrent state in the IGBT 1 from the detection voltage V13 indicated by the detection signal S13, which is an overcurrent detection signal.

As a result, the protection circuit provided outside the switching element driving circuit 52 can perform the protection operation, bringing the "L" level, which signifies the Off operation as directed by the element control signal S0, into effect.

In addition, the PNP bipolar transistor Q1, which turns On before the protection circuit executes the protection operation, can suppress the rise of the gate voltage VG of the IGBT 1 in advance; therefore, a phenomenon that the IGBT 1 is damaged due to a delay in the protection operation of the protection circuit is prevented from happening.

Embodiment 3

(Problem of Embodiment 2)

In the switching element drive circuit 52 of Embodiment 2, when the resistance value Rs of the resistance 13 is increased, the detection voltage V13 illustrated in the expression (6) can be increased; therefore, the detection sensitivity of the detection signal S13 can be increased. However, when the resistance value Rs is increased, the collector potential of the PNP bipolar transistor Q1 increases, which lowers the current magnitude flowing through the PNP bipolar transistor Q1 in the On state, and this reduces the effect of suppressing the gate voltage VG of the IGBT 1 from rising by the PNP bipolar transistor Q1 by the magnitude of current lowered. That is, regarding the increase or decrease of the resistance value Rs of the resistance 13, a trade-off relationship is established between the detection sensitivity of the detection signal S13 and the effect of suppressing the gate voltage VG from rising.

(Configuration of Embodiment 3)

Figure 4:
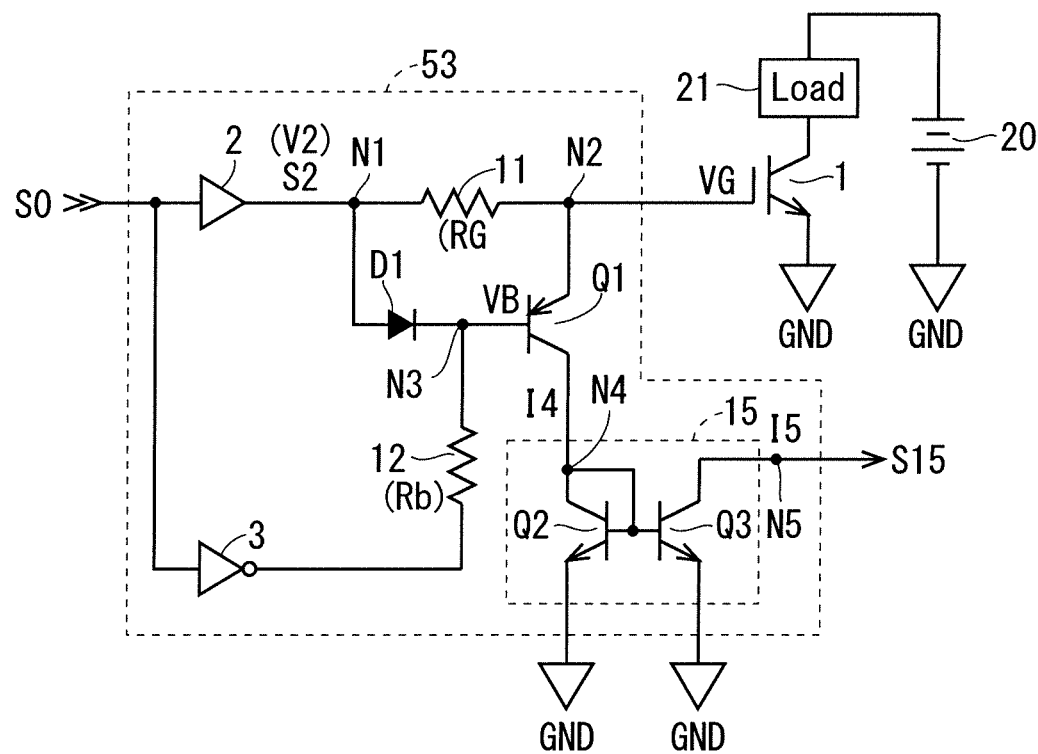
FIG. 4 A circuit diagram illustrating a circuit configuration of a switching element drive circuit according to Embodiment 3.

FIG. 4 is a circuit diagram illustrating a circuit configuration of a switching element drive circuit 53 according to Embodiment 3 of the present disclosure.

Parts similar to those of the switching element drive circuit 51 of Embodiment 1 illustrated in FIG. 1 are denoted by the same reference numerals, and descriptions thereof are omitted as appropriate. In the following, the characteristic portions of the switching element drive circuit 53 of Embodiment 3 will be mainly described.

The collector of the PNP bipolar transistor Q1 is connected to a current mirror circuit 15 at a node N4. The node N4 is a fourth node.

The current mirror circuit 15 includes NPN bipolar transistors Q2 and Q3 as main components. The base is shared between the NPN bipolar transistors Q2 and Q3.

The base and the collector of the NPN bipolar transistor Q2 are connected, the collector is connected to the collector of the PNP bipolar transistor Q1 at the node N4, and the emitter is connected to the reference potential GND. The emitter of the NPN bipolar transistor Q3 is set to the reference potential GND, and a current mirror signal S15 obtained from a node N5 connected to the collector serves as an overcurrent detection signal. The node N5 is a fifth node.

Accordingly, the collector of the PNP bipolar transistor Q1 is connected to the reference potential GND through the current mirror circuit 15.

The current mirror circuit 15 configured as described above receives a reference current I4 flowing through the node N4 connected to the collector of the PNP bipolar transistor Q1, and flows a mirror current I5 to the node N5 provided on a different current path from the node N4.

When the NPN bipolar transistors Q2 and Q3 are configured to have the same size, the mirror current I5 has the same current magnitude as the reference current I4. That is, the mirror current I5 has a current proportionality relationship with the reference current I4.

Therefore, by connecting one end of the detection resistance (not illustrated) to the node N5 and connecting the other end of the detection resistance to the reference potential GND, the voltage obtained from the node N5 is used as the detection voltage as in Embodiment 2. Based on the detection voltage, whether or not the IGBT 1 is in the overcurrent state can be detected.

At this point, the mirror current I5 flows through a current path independent of the one for the reference current I4, so even if the resistance value of the detection resistance corresponding to the mirror current I5 is increased, this will not affect the effect of suppressing the gate voltage VG from rising by the PNP bipolar transistor Q1. This is because even if the resistance value of the detection resistance corresponding to the mirror current I5 is increased, the collector potential of the PNP bipolar transistor Q1 does not increase, and the magnitude of current flowing through the PNP bipolar transistor Q1 in the On state is not affected.

That is, regarding the increase or decrease in the resistance value of the detection resistance corresponding to the mirror current I5, the detection sensitivity of the detection voltage corresponding to the mirror current I5 and the effect of suppressing the gate voltage VG from rising have a mutually independent relationship, which is not the trade-off relationship described in Embodiment 2.

The switching element drive circuit 53 of Embodiment 3 having such a configuration exhibits the following effects in addition to the effects of Embodiment 1.

In the switching element drive circuit 53 of Embodiment 3, it is the mirror current I5 that can be used as the target for overcurrent detection and not the reference current I4 of the current mirror circuit 15; therefore, the presence of the current mirror circuit 15 does not affect the operation of the PNP bipolar transistor Q1.

Therefore, in the switching element drive circuit 53 of Embodiment 3, by setting the resistance value of the detection resistance sufficiently high for the mirror current I5 of the current mirror circuit 15 for overcurrent detection, the presence or absence of the overcurrent state in the IGBT 1 can be detected with high sensitivity from the presence or absence of the mirror current I5 without affecting the operation of the PNP bipolar transistor Q1.

Embodiment 4

FIG. 5 is a circuit diagram illustrating a circuit configuration of a switching element drive circuit 54 according to Embodiment 4 of the present disclosure.

Parts similar to those of the switching element drive circuit 51 of Embodiment 1 illustrated in FIG. 1 are denoted by the same reference numerals, and descriptions thereof are omitted as appropriate. In the following, the characteristic portions of the switching element drive circuit 54 of Embodiment 4 will be mainly described.

In the switching element drive circuit 54 of Embodiment 4, a sink control circuit 16 is used as a base drive circuit instead of the inverting buffer 3 of Embodiment 1.

The sink control circuit 16 receives the element control signal S0 and the gate voltage VG, and outputs a sink control signal S16 as a base drive signal. As described earlier, the IGBT 1 turns On when the gate voltage VG exceeds the threshold voltage Vth.

The sink control circuit 16 is to be in one of the following states (1) and (2) during the turn-Off start period in which the element control signal S0 indicates the "L" level and the gate voltage VG exceeds the threshold voltage Vth.

State (1) . . . . The sink control signal S16 is in a high impedance state.

State (2) . . . . The sink control signal S16 is set to the power supply voltage Vcc as the base drive voltage.

State (1) means that the output by the sink control circuit 16 is in a high impedance state, that is, in a floating state.

State (2) means that the base drive voltage of the sink control signal S16 is set to the power supply voltage Vcc.

In State (1), the resistance 12 connected to the node N3 is disabled, and no base current flows through the resistance 12, so the PNP bipolar transistor Q1 is turned Off.

In State (2), the potential of the node N3 is set sufficiently high, so the PNP bipolar transistor Q1 is turned Off.

That is, the sink control circuit 16 turns Off the PNP bipolar transistor Q1 by the sink control signal S16 during the turn-Off start period.

Further, the sink control circuit 16 is set to the reference potential GND with the sink control signal S16 as the base drive voltage except during the turn-Off start period.

The sink control circuit 16 that performs the above-described operation can be configured by existing technique using logic elements and the like.

The switching element drive circuit 54 of Embodiment 4 having such a configuration exhibits the effects similar to that of Embodiment 1 and, further exhibits the following effects.

The switching element drive circuit 54 of Embodiment 4 turns Off the PNP bipolar transistor Q1 by the sink control signal S16 during the turn-Off start period described above. The turn-Off start period is at least a partial period included in the Off-operation period.

Therefore, the presence of the PNP bipolar transistor Q1 does not adversely affect the turn-Off operation of the IGBT 1 during the turn-Off start period.

Further, even in the Off-operation period in which the device control signal S0 is at the "L" level, the sink control signal S16 is set to the reference potential GND when the gate voltage VG is lower than the threshold voltage Vth. That is, the PNP bipolar transistor Q1 can be turned On/Off based on the base-emitter voltage VBE.

Therefore, the switching element drive circuit 54 of Embodiment 4 turns On the PNP bipolar transistor Q1 as necessary, thereby performing the sink-operation that stabilizes the gate voltage VG at the reference potential GND during the Off-operation period except for the turn-Off start period.

As a result, the switching element drive circuit 54 in Embodiment 4 performs the sink-operation during the Off-operation period except for the turn-Off start period, which allows for the prevention of self turning On in which the IGBT 1 may mistakenly turn On by a gate voltage spike due to external noise or the like during the Off-operation period of the IGBT 1.

While a typical gate sink circuit that performs the sink-operation is provided separately from the switching element drive circuit, the switching element drive circuit 54 of Embodiment 4 performs the sink-operation by itself; therefore, no separately gate sink circuit is required to be provided.

Further, the sink control circuit 16 outputs the sink control signal S16 indicating the reference potential GND as the base drive voltage during the On-operation period when the element control signal S0 indicates the "H" level, this allows the PNP bipolar transistor Q1 to perform on/Off-operation based on the base-emitter voltage VBE during the On-operation period of the IGBT 1.

Accordingly, in the switching element drive circuit 54 of Embodiment 4, the PNP bipolar transistor Q1 is always turned On when the IGBT 1 is in the overcurrent state; therefore, similar to Embodiment 1, the increase in gate voltage VG of the IGBT 1 is suppressed and the increase in load current of the IGBT 1 is effectively suppressed.

Embodiment 5

Figure 6:
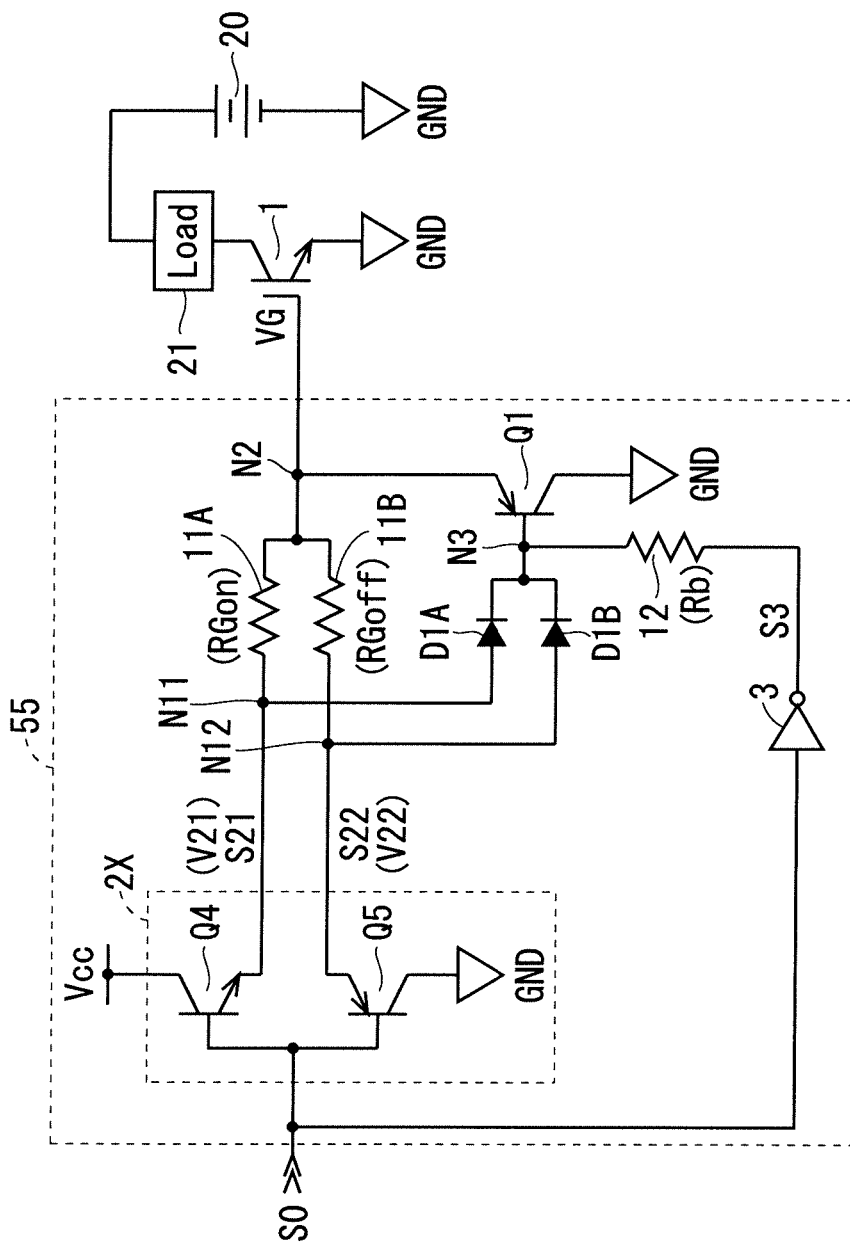
FIG. 6 A circuit diagram illustrating a circuit configuration of a switching element drive circuit according to Embodiment 5.

FIG. 6 is a circuit diagram illustrating a circuit configuration of a switching element drive circuit 55 according to Embodiment 5 of the present disclosure.

Parts similar to those of the switching element drive circuit 51 of Embodiment 1 illustrated in FIG. 1 are denoted by the same reference numerals, and descriptions thereof are omitted as appropriate. In the following, the characteristic portions of the switching element drive circuit 55 of Embodiment 5 will be mainly described.

In the switching element drive circuit 55 of Embodiment 5, a buffer 2X is used as a base drive circuit instead of the buffer 2 of Embodiment 1.

Further, the switching element drive circuit 55 of Embodiment 5 uses resistances 11A and 11B instead of the resistance 11 of Embodiment 1 and uses diodes D1A and D1B instead of the diode D1 of Embodiment 1.

The buffer 2X includes an NPN bipolar transistor Q4 and a PNP bipolar transistor Q5 as its main components.

The NPN bipolar transistor Q4 receives the power supply voltage Vcc at its collector, which is one electrode thereof, and the element control signal S0 at its base, which is a control electrode thereof. The NPN bipolar transistor Q4 becomes a source-side transistor.

The NPN bipolar transistor Q4 is turned On when the element control signal S0 indicates "H", and a gate drive signal S21 is obtained from the emitter, which is the other electrode of the NPN bipolar transistor Q4. Therefore, when the element control signal S0 is "H", a gate drive voltage V21 of the gate drive signal S21 becomes the power supply voltage Vcc. The gate drive signal S21 becomes the source-side gate drive signal.

On the other hand, the NPN bipolar transistor Q4 is turned Off when the element control signal S0 indicates "L". Therefore, when the element control signal S0 is "L", the gate drive signal S21 is in a floating state.

The collector of the PNP bipolar transistor Q5 is set to the reference potential GND, which is one electrode thereof, and receives the element control signal S0 at its base, which is a control electrode thereof. The PNP bipolar transistor Q5 becomes a sink-side transistor.

The PNP bipolar transistor Q5 is turned On when the element control signal S0 indicates "L", and a gate drive signal S22 is obtained from the emitter, which is the other electrode of the PNP bipolar transistor Q5. Therefore, when the element control signal S0 is "L", a gate drive voltage V22 of the gate drive signal S22 becomes the reference potential GND. The gate drive signal S22 becomes the sink-side gate drive signal.

On the other hand, the PNP bipolar transistor Q5 is turned Off when the element control signal S0 indicates "H". Therefore, when the element control signal S0 is "H", the gate drive signal S22 is in a floating state.

Thus, in Embodiment 5, the gate drive signal S21 that is the source-side gate drive signal and the gate drive signal S22 that is the sink-side gate drive signal are included as the gate drive signals. And, the gate drive voltage V21 that is a source-side gate drive voltage and a gate drive voltage V22 that is a sink-side gate drive voltage are included as the gate drive voltage.

In the buffer 2X illustrated in Embodiment 5, the emitter of the NPN bipolar transistor Q4 and the emitter of the PNP bipolar transistor Q5 are electrically separated. Note that regarding the buffer 2 illustrated in Embodiments 1 to 4, if it consists of a bipolar transistor pair Q4 and Q5 similar to the buffer 2X, the emitter of the NPN bipolar transistor Q4 and the emitter of the PNP bipolar transistor Q5 are electrically connected.

The resistance 11A is interposed between the emitter of the NPN bipolar transistor Q4 and the gate electrode of the IGBT 1. One end of the resistance 11A is connected to a node N11 on the emitter side of the NPN bipolar transistor Q4, and the other end is connected to a node N2 on the gate electrode side of the IGBT 1. The resistance 11A becomes a source-side gate resistance, and the node N11 becomes a source-side first node. The resistance 11A has a gate resistance value RGon.

The resistance 11B is interposed between the emitter of the PNP bipolar transistor Q5 and the gate electrode of the IGBT 1. One end of the resistance 11B is connected to a node N12 on the emitter side of the PNP bipolar transistor Q5, and the other end is connected to the node N2 on the gate electrode side of the IGBT 1. The resistance 11B becomes a sink-side gate resistance, and the node N12 becomes a sink-side first node. The resistance 11B has a gate resistance value RGoff.

Thus, in Embodiment 5, the resistance 11A that is the source-side gate resistance and the resistance 11B that is the sink-side gate resistance are included as the gate resistances.

Similarly, the first node includes a node N11 that is a source-side first node and a node N12 that is a sink-side first node.

The diode D1A has an anode connected to the node N11 and a cathode connected to a node N3. The diode D1A becomes a source-side diode.

The diode DIB has an anode connected to the node N12 and a cathode connected to the node N3. The diode DIB becomes a sink-side diode.

As described above, in Embodiment 5, the diode D1A that is the source-side diode and the diode DIB that is the sink-side diode are included as the overcurrent detection diodes.

One end of the resistance 12 is connected to the node N3. The resistance 12 functions as a base current resistance and has a resistance value Rb.

Thus, in Embodiment 5, a source-side component group is included that includes the node N11, the resistance 11A, and the diode D1A corresponding to the NPN bipolar transistor Q4, which is the source-side transistor.

Similarly, a sink-side component group is included that includes the node N12, the resistance 11B, and the diode DIB corresponding to the sink-side transistor PNP bipolar transistor Q5.

The source-side component group and the sink-side component group are provided in mutually independent current paths; therefore, the source-side component group and the sink-side component group are not electrically affected therebetween.

Therefore, the gate resistance value RGon of the resistance 11A and the gate resistance value RGoff of the resistance 11B can be set independently of each other. The detailed description regarding this point will be provided below.

When the element control signal S0 is at the "H" level, the NPN bipolar transistor Q4 of the bipolar transistor pair Q4 and Q5 is turned On, and the PNP bipolar transistor Q5 is turned Off.

Therefore, of the gate drive signals S21 and S22, only the gate drive signal S21 is enabled, and as a result, the above source-side component group is enabled and the above sink-side component group is disabled. That is, the resistance 11A and the diode D1A connected to the node N11 are enabled, and the resistance 11B and the diode D1B connected to the node N12 are disabled.

Therefore, the gate resistance value RGon of the resistance 11A can be set as a resistance value dedicated to turning On. At this point, the gate resistance value RGoff of the resistance 11B is not involved in the turn-On operation.

When the element control signal S0 is at the "L" level, the PNP bipolar transistor Q5 of the bipolar transistor pair Q4 and Q5 is turned On, and the NPN bipolar transistor Q4 is turned Off.

Therefore, of the gate drive signals S21 and S22, only the gate drive signal S22 is enabled, and as a result, the above sink-side component group is enabled and the above source-side component group is disabled. That is, the resistance 11B and the diode D1B connected to the node N12 are enabled, and the resistance 11A and the diode D1A connected to the node N11 are disabled.

Therefore, the gate resistance value RGoff of the resistance 11B can be set as a resistance value dedicated to turn Off. At this point, the gate resistance value RGon of the resistance 11A is not involved in the turn-Off operation.

The switching element drive circuit 55 of Embodiment 5 having such a configuration exhibits the effects similar to that of Embodiment 1 and, further exhibits the following effects.

The switching element drive circuit 55 of Embodiment 5 uses the resistance 11A, which is the source-side gate resistance, as the dedicated gate resistance at turning On, and the resistance 11B, which is the sink-side gate resistance, as the dedicated gate resistance at turning Off. In other words, the gate resistance used is changed between turning On and turning Off.

Therefore, the turning-On speed at the time of turning On can be individually set by the gate resistance value RGon of the resistance 11A and the turning-Off speed at the time of turning Off can be individually set by the gate resistance value RGoff of the resistance 11B.

Note that the operation of switching element drive circuit 55 when the IGBT 1 is in the overcurrent state is different from that in Embodiment 1. The description regarding this point will be provided below.

During the On-operation period of the IGBT 1, when a load short circuit or the like occurs in the IGBT 1 and the gate voltage VG of the IGBT 1 becomes higher than the gate drive voltage V21 of the gate drive signal S21, a current flows from the gate electrode of the IGBT 1 toward the node N12 that is the sink-side output terminal of the buffer 2X through the resistance 11B.

As a result, the potential of the node N3 is pulled up by the diode D1B. At this point, if the magnitude of current flowing from the gate of the IGBT 1 toward the node N12 is represented by I12, the base-emitter voltage VBE of the PNP bipolar transistor Q1 is represented by the following expression (7).

$$VBE = -1VF - I12 \times RGoff \qquad (7)$$

Note that in the expression (7), VF represents the forward voltage of the diode DIB.

The PNP bipolar transistor Q1 is turned On by the base-emitter voltage VBE that has changed as illustrated in the expression (7), allowing a current to flow from the node N2 toward the reference potential GND.

As a result, the switching element drive circuit 55 of Embodiment 5 can suppress an increase in gate voltage VG of the IGBT 1 and suppress an increase in load current flowing through the IGBT 1. Therefore, the IGBT 1 would not be in the overcurrent state and broken.

FIG. 7 is a circuit diagram illustrating a circuit configuration of another buffer 2Y. In the drawing, the buffer 2Y includes a PMOS transistor Q14 and an NMOS transistor Q15 as its main components.

Unlike the buffer 2X, the buffer 2Y is a circuit based on the premise that the "L" level signifies the On operation, and the "H" level signifies the Off-operation as directed by the element control signal S0.

The PMOS transistor Q14 receives the power supply voltage Vcc at its source, which is one electrode thereof, and the element control signal S0 at its gate, which is a control electrode thereof. The PMOS transistor Q14 becomes a source-side transistor.

The PMOS transistor Q14 is turned On when the element control signal S0 indicates "L", and the gate drive signal S21 can be obtained from the drain which is the other electrode thereof. Therefore, when the element control signal S0 is "L", the gate drive voltage V21 of the gate drive signal S21 becomes the power supply voltage Vcc. The gate drive signal S21 becomes the source-side gate drive signal.

The source of the NMOS transistor Q15, which is one electrode thereof, is set to the reference potential GND and receives the element control signal S0 at its gate, which is a control electrode thereof. The NMOS transistor Q15 becomes a sink-side transistor.

The NMOS transistor Q15 is turned On when the element control signal S0 indicates "H", and the gate drive signal S22 can be obtained from the drain which is the other electrode thereof. Therefore, when the element control signal S0 is "H", the gate drive voltage V22 of the gate drive signal S22 becomes the reference potential GND. The gate drive signal S22 becomes the sink-side gate drive signal.

Thus, the buffer 2Y using the MOSFET pair Q14 and Q15 may be replaced with the buffer 2X. Note that when the buffer 2X is replaced with the buffer 2Y in the switching element drive circuit 55, the inverting buffer 3 needs to be replaced with a non-inverting buffer.

Further, similar to Embodiment 1, also in Embodiment 5, in order to adjust the turn-On speed of the IGBT 1, the element control signal S0 may have a rising ramp waveform or a waveform that increases step by step instead of the rectangular wave. Also in this case, when an abnormality such as a load short circuit of the IGBT 1 occurs, the phenomenon that the gate voltage VG of the IGBT 1 rises occurs similarly to the case where the element control signal S0 is rectangular. However, as described above, when the PNP bipolar transistor Q1 is turned On when the IGBT 1 is in the overcurrent state; therefore, an increase in gate voltage VG can be suppressed, and the overcurrent state of the IGBT 1 can be swiftly canceled.

<Others>

In above-described Embodiments, the N-channel IGBT 1 is illustrated as the N-channel semiconductor switching element having the gate electrode of the insulated gate structure. N-channel switching elements other than the IGBTs may be used as switching elements. As another switching element, for example, an N-channel MOSFET having a SiC structure can be considered.

Further, the reference potential GND is not limited to the ground level, and the reference potential may be set as a fixed potential other than the ground level that can serve as a reference.

While the disclosure has been described in detail, the forgoing description is in all aspects illustrative and not restrictive. It is understood that numerous other modifications can be devised without departing from the scope of the present disclosure.

The invention claimed is:

1. A switching element drive circuit for driving an N-channel switching element having a gate electrode with an insulated gate structure, comprising:
   a gate drive circuit that outputs a gate drive signal based on an element control signal received from outside;
   a gate resistor interposed between an output of the gate drive circuit and a gate electrode of the switching element, having one end thereof connected to a first node on an output side of the gate drive circuit, and having an other end thereof connected to a second node on a gate electrode side of the switching element;
   a PNP bipolar transistor having an emitter connected to the second node and a collector connected to a reference potential;
   a diode having an anode connected to the first node and a cathode connected to a base of the PNP bipolar transistor at a third node;
   a base connection resistor having one end thereof connected to the third node; and
   a base drive circuit that outputs a base drive signal based on the element control signal, wherein
   the base drive signal is given to an other end of the base connection resistor,
   a voltage obtained from the second node becomes a gate voltage of the switching element,
   the gate drive circuit
      sets a gate drive voltage of the gate drive signal to a power supply voltage during an On-operation period in which the element control signal indicates an On state of the switching element, and
      sets the gate drive voltage of the gate drive signal to the reference potential during an Off-operation period in which the element control signal indicates an off state of the switching element, and
   the base drive circuit
      sets a base drive voltage of the base drive signal to the reference potential during the On-operation period, and
      turns Off the PNP bipolar transistor by the base drive signal during at least a partial period in the Off-operation period.

2. The switching element drive circuit according to claim 1, wherein
   the element control signal indicates the On-operation period at an "H" level and indicates the Off-operation period at an "L" level,
   both the gate drive circuit and the base drive circuit operate with the "H" level as the power supply voltage and the "L" level as the reference potential,
   the gate drive circuit is a gate drive buffer that inputs the element control signal and outputs the gate drive signal, in which the gate drive signal indicates a same logic level as the element control signal, and
   the base drive circuit is a base drive buffer that inputs the element control signal and outputs the base drive signal, in which the base drive signal indicates a logic level opposite to that of the element control signal.

3. The switching element drive circuit according to claim 1, wherein
   the collector of the PNP bipolar transistor is connected to the reference potential through a detection resistor, the collector of the PNP bipolar transistor and one end of the detection resistor are connected at a fourth node, and a signal obtained from the fourth node becomes an overcurrent detection signal.

4. The switching element drive circuit according to claim 1, wherein the collector of the PNP bipolar transistor is connected to the reference potential through a current mirror circuit, and the current mirror circuit is connected to the collector of the PNP bipolar transistor at a fourth node, receives a reference current flowing through the fourth node, allows a mirror current to flow through a fifth node provided on a current path different from that of the fourth node, and the mirror current has a current proportionality relationship with the reference current.

5. The switching element drive circuit according to claim 1, wherein the element control signal indicates the On-operation period at an "H" level and indicates the Off-operation period at an "L" level, both the gate drive circuit and the base drive circuit operate with the "H" level as the power supply voltage and the "L" level as the reference potential, the gate drive circuit is a gate drive buffer that inputs the element control signal and outputs the gate drive signal, in which the gate drive signal indicates a same logic level as the element control signal, the base drive circuit is a sink control circuit that inputs the element control signal and the gate voltage and outputs a sink control signal as the base drive signal, the switching element is turned On when the gate voltage exceeds a threshold voltage, and the sink control circuit,
in a turn-Off start period in which the element control signal indicates the "L" level and the gate voltage exceeds the threshold voltage, turns Off the PNP bipolar transistor by the sink control signal, in which the at least partial period of the Off-operation period is the turn-Off start period, and, except during the turn-Off start period, sets the sink control signal to the reference potential as the base drive voltage.

6. The switching element drive circuit according to claim 2, wherein the gate drive buffer includes
a source-side transistor that receives the power supply voltage at one electrode and receives the element control signal at a control electrode, and a sink-side transistor having one electrode set to the reference potential and receiving the element control signal at the control electrode, the gate drive signal includes a source-side gate drive signal and a sink-side gate drive signal, and a signal obtained from an other electrode of the source-side transistor becomes the source-side gate drive signal, and a signal obtained from an other electrode of the sink-side transistor becomes the sink-side gate drive signal, the source-side transistor is turned On when the element control signal indicates "H", the sink-side transistor is turned On when the element control signal indicates "L", the gate resistor includes a source-side gate resistor and a sink-side gate resistor, the diode includes a source-side diode and a sink-side diode, the first node includes a source-side first node and a sink-side first node, the other electrode of the source-side transistor is connected to one end of the source-side gate resistor at the first source-side node, the other electrode of the sink-side transistor is connected to one end of the sink-side gate resistor at the first sink-side node, an other end of the source-side gate resistor and an other end of the sink-side gate resistor are commonly connected to the second node, the source-side diode has an anode connected to the source-side first node and a cathode connected to the third node, and the sink-side diode has an anode connected to the sink-side first node and a cathode connected to the third node.

7. The switching element drive circuit according to claim 2, wherein the collector of the PNP bipolar transistor is connected to the reference potential through a detection resistor, the collector of the PNP bipolar transistor and one end of the detection resistor are connected at a fourth node, and a signal obtained from the fourth node becomes an overcurrent detection signal.

8. The switching element drive circuit according to claim 2, wherein the collector of the PNP bipolar transistor is connected to the reference potential through a current mirror circuit, and the current mirror circuit is connected to the collector of the PNP bipolar transistor at a fourth node, receives a reference current flowing through the fourth node, allows a mirror current to flow through a fifth node provided on a current path different from that of the fourth node, and the mirror current has a current proportionality relationship with the reference current.

* * * * *